(12) United States Patent
Brunner et al.

(10) Patent No.: US 7,656,917 B2
(45) Date of Patent: Feb. 2, 2010

(54) CIRCUIT ARRANGEMENT FOR GENERATING LIGHT PULSES

(75) Inventors: Rolf Brunner, Eichenau (DE); Robert Auer, Munich (DE); Franz Kappeler, Puchheim (DE)

(73) Assignee: Leuze Lumiflex GmbH & Co. KG, Fuerstenfeldbruck (DE)

(*) Notice: Subject to any disclaimer, the term of this patent is extended or adjusted under 35 U.S.C. 154(b) by 68 days.

(21) Appl. No.: 11/436,196

(22) Filed: May 18, 2006

(65) Prior Publication Data

US 2006/0280214 A1 Dec. 14, 2006

(30) Foreign Application Priority Data

May 18, 2005 (DE) .................. 10 2005 022 715

(51) Int. Cl.
*H01S 3/00* (2006.01)
(52) U.S. Cl. .............. 372/38.08; 372/38.1; 372/38.01; 372/38.02; 372/38.03; 372/38.07
(58) Field of Classification Search ............ 372/38.1, 372/38.01, 38.02, 38.03, 38.07, 38.08
See application file for complete search history.

(56) References Cited

U.S. PATENT DOCUMENTS 3,648,073 A * 3/1972 Sams et al. ............ 327/111
5,089,727 A * 2/1992 Molitor et al. ............ 327/181
5,444,729 A * 8/1995 Chung .................... 372/38.02
5,745,276 A * 4/1998 Ho et al. .................. 398/209
6,298,046 B1 * 10/2001 Thiele ..................... 370/282
6,798,797 B2 * 9/2004 Mangano et al. ......... 372/29.01

FOREIGN PATENT DOCUMENTS

| DE | 1265202 | 6/1966 |
| DE | 2908854 C2 | 9/1980 |
| DE | 3738771 A1 | 3/1988 |
| DE | 19514062 A1 | 11/1995 |
| JP | 1117382 A | 5/1989 |

OTHER PUBLICATIONS

German Office Action dated Mar. 2, 2006.

* cited by examiner

*Primary Examiner*—Minsun Harvey
*Assistant Examiner*—Kinam Park
(74) *Attorney, Agent, or Firm*—Venable LLP; Robert Kinberg; Kyle D. Petaja

(57) ABSTRACT

A circuit arrangement for generating light pulses includes an electro-optical converter; a switching element; and a charge store. The electro-optical converter is connected to the charge store via the switching element. The closing of the switching element triggers a discharging process in the charge store and, in the process, generates an electrical pulse that is converted to a light pulse in the electro-optical converter. First and second impedance matching circuits are arranged, respectively, between the charge store and the switching element and between the switching element and the electro-optical converter.

17 Claims, 5 Drawing Sheets

CIRCUIT ARRANGEMENT FOR GENERATING LIGHT PULSES

CROSS-REFERENCE TO RELATED APPLICATION

This application claims the priority of German Patent Application No: DE 10 2005 022 715.5, filed on May 18, 2005, the subject matter of which is incorporated herein by reference.

BACKGROUND OF THE INVENTION

The invention generally relates to a circuit arrangement that may be used to generate light pulses.

Circuit arrangements of this type are used in particular as transmitting units for optical sensors. These optical sensors can be embodied as distance sensors, which typically operate based on the light transit time method. For the distance measuring, light pulses are generated with predetermined timing with the aid of the circuit arrangement of the transmitting unit. The transit time of a light pulse to the object and back to the optical sensor is evaluated as a measure of the distance between an object and the optical sensor.

To achieve a highly precise distance measurement, it is necessary to generate sequences of very short light pulses, wherein the pulse duration of a light pulse typically is approximately one nanosecond. Accordingly, light pulses of this type are also required to have extremely short rise times below one nanosecond.

Circuit arrangements of this type for generating the aforementioned short light pulses are provided with laser diodes functioning as electro-optical converters. A charge store, typically a charge capacitor, is connected to this laser diode by way of a switching element, for example, a transistor.

The charge capacitor is discharged by closing the switching element and, in the process, a current pulse is generated, which is then converted in the laser diode to a light pulse.

With ideal components for such a circuit arrangement, the resulting time history for the current pulse would correspond to a discharge of an ideal RC (resistance-capacitance) element. This would mean an infinitely rapid rise time for the current pulse and an exponential decay of the current pulse.

However, during actual operations system-related deviations occur from the ideal time history of such current pulses, wherein these deviations in particular are caused by parasitic inductances in the components used.

A first deviation is that a finite rise time is obtained for the current pulse in place of an infinitely rapid rise time. Furthermore, the time history of the current pulse takes the form known for the discharge of an RLC (resistance-inductance-capacitance) element. Accordingly, post-oscillations occur during the decay of the current pulse. These post-oscillations comprise negative undershoots which are followed by positive overshoots. The negative undershoots polarize the laser diode in non-conducting direction and result in a Zener breakdown of the pn junction for the laser diode, thereby drastically reducing its operating life.

If the positive overshoots of the current pulse exceed a specific amplitude value, additional parasitic light pulses can thus be generated in the laser diode which follow the actual light pulse and result in distorting the distance measurements.

SUMMARY OF THE INVENTION

It is therefore an object of the present invention to provide a circuit arrangement of the aforementioned type, which makes it possible to generate light pulses with the lowest possible rise times and without interfering post-oscillations.

This object may be achieved using various embodiments of the invention, as claimed. In one embodiment, a circuit arrangement for generating light pulses, comprising: an electro-optical converter; a switching element; a charge store, wherein the electro-optical converter is connected to the charge store via the switching element, and wherein the closing of the switching element triggers a discharging process in the charge store and, in the process, generates an electrical pulse that is converted to a light pulse in the electro-optical converter; and first and second impedance matching circuits arranged, respectively, between the charge store and the switching element and between the switching element and the electro-optical converter.

The basic idea behind the invention is that super-imposed current and/or voltage waves cannot form owing to the impedance matching according to the invention with the aid of the matching circuits arranged between the charge store and the switching element, as well as between the switching element and the electro-optical converter, which is preferably a laser diode. Current and voltage waves of this type, which travel between the components of the circuit arrangement and are reflected back by these, are the main reason for the appearance of post-oscillations in the current pulses generated in the circuit arrangement.

Avoiding or at least significantly reducing the current and voltage waves systematically prevents post-oscillations in the current pulses, in particular negative undershoots that result in shortening the operating life of the laser diode functioning as electro-optical converter. Also avoided are positive overshoots, which would result in the emission of undesirable parasitic light pulses by the laser diode. Furthermore, the circuit arrangement according to the invention makes it possible to significantly shorten the rise times for the current and light pulses.

The circuit arrangement according to the invention can therefore be used particularly advantageously as a transmitting unit in optical sensors, in particular in distance sensors operating based on the light-transit time method, wherein these sensors make it possible to realize highly precise and fast distance measurements.

The matching circuits for eliminating current and voltage waves traveling between the components of the circuit arrangement have a simple layout and can be produced cost-effectively, wherein the circuit arrangement components in general can be active and/or passive components.

The components of the matching circuits are generally dimensioned such that parasitic inductances of the charge store, the switching element, and the electro-optical converter are taken into account. The matching circuits consequently simulate circuit lines with defined wave resistances and limit frequencies, which eliminate or at least strongly reduce the reflections of current and voltage waves between the charge store and the switching element, as well as between the switching element and the electro-optical converter.

According to one advantageous embodiment of the invention, a first matching circuit is provided as a separate unit for adapting the internal resistance of the charge store to the complex input resistance of the switching element. A second matching circuit is furthermore provided as separate unit for matching the impedance between switching element and electro-optical converter. With this type of embodiment, the charge store in particular can be a single charge capacitor.

According to a different, advantageous embodiment of the invention, the first matching circuit can be integrated into the charge store. In that case, the charge store preferably comprises a multiple-unit arrangement of charge capacitors which form a circuit network together with the components of the first matching circuit.

BRIEF DESCRIPTION OF THE DRAWINGS

These and other features and advantages of the invention will be further understood from the following detailed description of the preferred embodiments and with reference to the accompanying schematic drawings, in which.

DETAILED DESCRIPTION OF EXEMPLARY EMBODIMENTS

Figure 1:
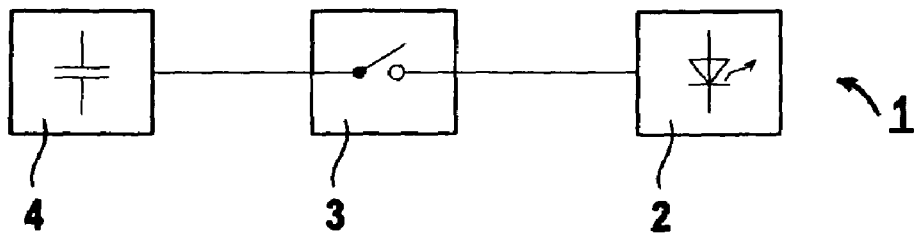
FIG. 1 shows a schematic representation of a circuit arrangement for generating light pulses, as disclosed in prior art.

FIG. 1 shows a circuit arrangement 1 according to prior art for generating short light pulses. The arrangement comprises an electro-optical converter in the form of a laser diode 2 that emits laser light. To enable the laser diode 2 to emit short light pulses, preferably in the nanosecond range, the laser diode is connected via an electronic switching element 3 to a charge store, which for the present case is a charge capacitor 4. The switching element 3 is a transistor, typically an avalanche transistor.

To generate a light pulse, an external trigger signal is used to close the switching element 3. As a result, the charge capacitor 4 is discharged and, in the process, a current pulse i(t) is generated, which travels through the laser diode 2 and is converted in the laser diode 2 to a light pulse p(t).

Figure 2:
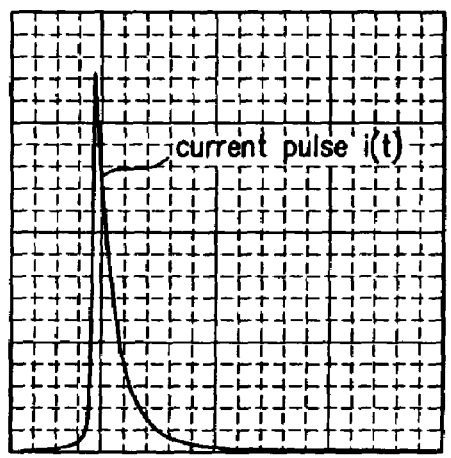
FIG. 2 shows the time history for an ideal current pulse generated with the circuit arrangement according to FIG. 1.

FIG. 2 shows the time history of the current pulse i(t), which essentially corresponds to the time history of the light pulse p(t) if the components of the circuit arrangement 1 are ideal components. In the ideal case, the current pulse has an infinitely short rise time and an exponential decay behavior, corresponding to the characteristic of a RC element.

However, system-related inherent parasitic inductances for the components of the circuit arrangement 1, as well as connection inductances of the transistor and the laser diode 2, cause general deviations from this ideal time history for the current pulse i(t).

Figure 3:
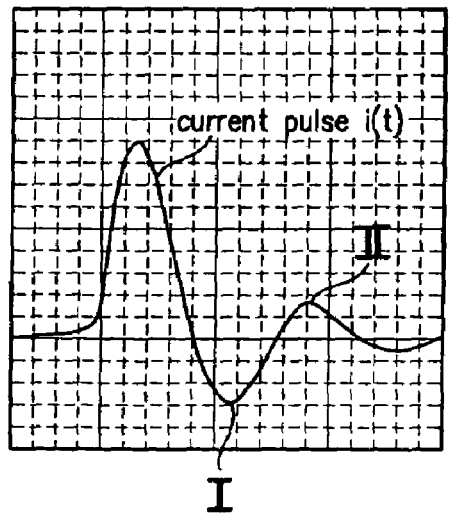
FIG. 3 shows the time history for an actual current pulse generated with the circuit arrangement according to FIG. 1.

FIG. 3 shows the actual time history for the current pulse i(t) of the circuit arrangement 1 according to FIG. 1. Parasitic inductances in the circuit arrangement 1 will result in a finite rise time of the current pulse i(t). As a result of the existing parasitic inductances, the current pulse i(t) decay behavior corresponds to that of an RLC element, and no exponential decay of the current pulse occurs, as shown in FIG. 3. Rather, the positive current pulse i(t) is followed by a negative undershoot I, which is followed by a positive overshoot II. Undershoots of this type polarize the laser diode 2 in the non-conducting direction and cause a Zener breakdown of the pn junction, thereby considerably reducing the operating life of the laser diode 2. In the event that positive overshoots exceed specific amplitude values, these generate additional parasitic light pulses on the light pulse generated with the current pulse i(t). If the circuit arrangement 1 is used for realizing a distance measurement according to the light-transit time method, for example, these parasitic light pulses lead to distortions in the distance measurements.

Figure 4:
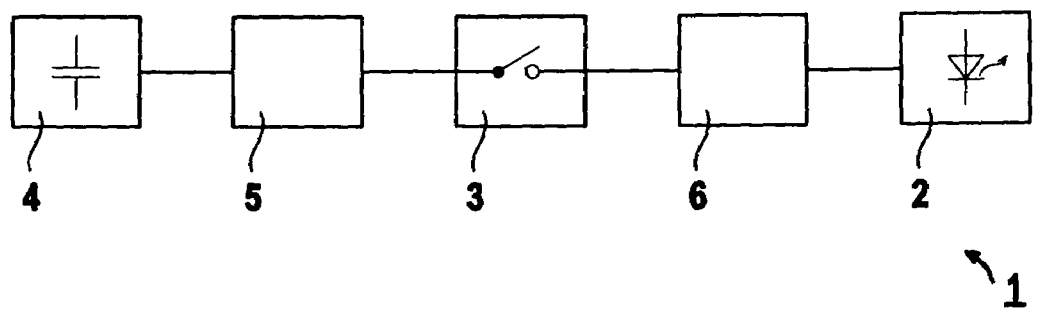
FIG. 4 shows a schematic representation of a first embodiment of the circuit arrangement according to the invention for generating light pulses.

FIG. 4 illustrates the basic layout of an exemplary embodiment of the circuit arrangement 1 according to the invention, which is designed to eliminate for the most part the interfering influences caused by parasitic inductances within the circuit arrangement 1.

Corresponding to the circuit arrangement 1 shown in FIG. 1, the circuit arrangement 1 according to FIG. 4 also comprises a laser diode 2 with a charge capacitor 4 and a switching element 3 connected thereto. The switching element 3 can again be a transistor, for example, an avalanche transistor, a MOSFET transistor, or an IGBT transistor. A first matching circuit 5 is provided between the charge capacitor 4 and the switching element 3 to eliminate the aforementioned interfering influences. A second matching circuit 6 is furthermore provided between the switching element 3 and the electro-optical converter.

Figure 5:
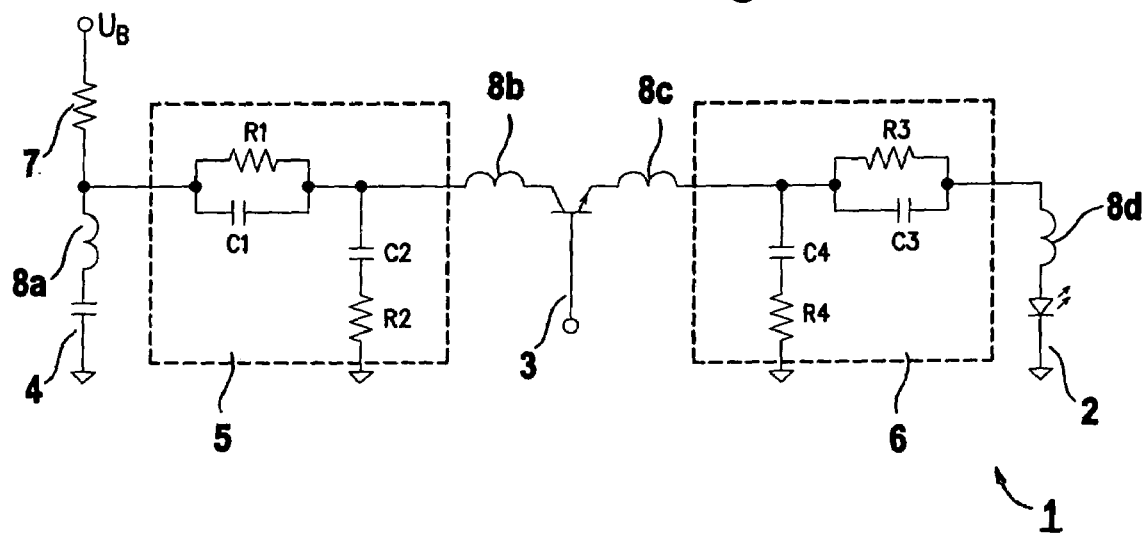
FIG. 5 shows a detailed representation of a circuit arrangement according to FIG. 4.

FIG. 5 shows the circuitry which can be realized for the circuit arrangement 1 according to FIG. 4. The switching element 3 in this case is an avalanche transistor. The charge capacitor 4 is connected via a resistance 7 to a voltage supply $U_B$. FIG. 5 furthermore shows the existing parasitic inductances $8a$-$8d$ present in the circuit arrangement 1, wherein these are attributed to the charge capacitor 4, the switching element 3, and the laser diode 2 as components of the circuit arrangement 1.

The two matching circuits 5, 6 are provided to eliminate the influence of these parasitic inductances $8a$-$8d$.

In the present case, the first matching circuit 5 comprises two RC elements $R_1C_1$ and $R_2C_2$. The second matching circuit 6 also comprises two RC elements $R_3C_3$ and $R_4C_4$.

The parasitic inductances $8a$-$8d$ are taken into account for the dimensioning of the RC elements in both matching circuits 5, 6. The first matching circuit 5 consequently functions to adapt or match the inherent complex resistance of the charge capacitor 4 to the inherent resistance of the switching element 3. The second matching circuit 6 functions to adapt the impedance between the switching element 3 and the laser diode 2. As a result of dimensioning the first matching circuit 5 in this way, only one current or voltage wave is generated and propagates from the charge capacitor 4 in the direction of the switching element 3 when the switching element 3 is operated, meaning it closes following the triggering by an external signal. The impedance matching achieved with the first matching circuit 5 thus prevents the current or voltage wave from being reflected back from the switching element 3 to the charge capacitor 4. The second matching circuit 6 functions to allow the current and voltage wave, which leaves the circuit element 3, to travel without reflection to the laser diode 2.

In general, the influences of parasitic inductances can be systematically compensated with the aid of the matching circuits 5, 6, thereby making it possible to eliminate or for the most part suppress current and voltage waves that travel back and forth between the components of the circuit arrangement 1. Since the parasitic inductances are taken into consideration for dimensioning the matching circuits 5, 6, their influence can be compensated even if the components are encased transistors or if laser diodes 2 are used, for which the feed line inductances are extremely high.

The matching circuit 5, 6 according to the invention thus simulates a transmission line with defined wave resistance in the circuit arrangement 1. This not only results in a considerable shortening of the rise times for the current pulses i(t) generated in the circuit arrangement 1, but it also leads to avoiding undershoots and overshoots during the decay of the current pulse i(t).

Figure 6A:
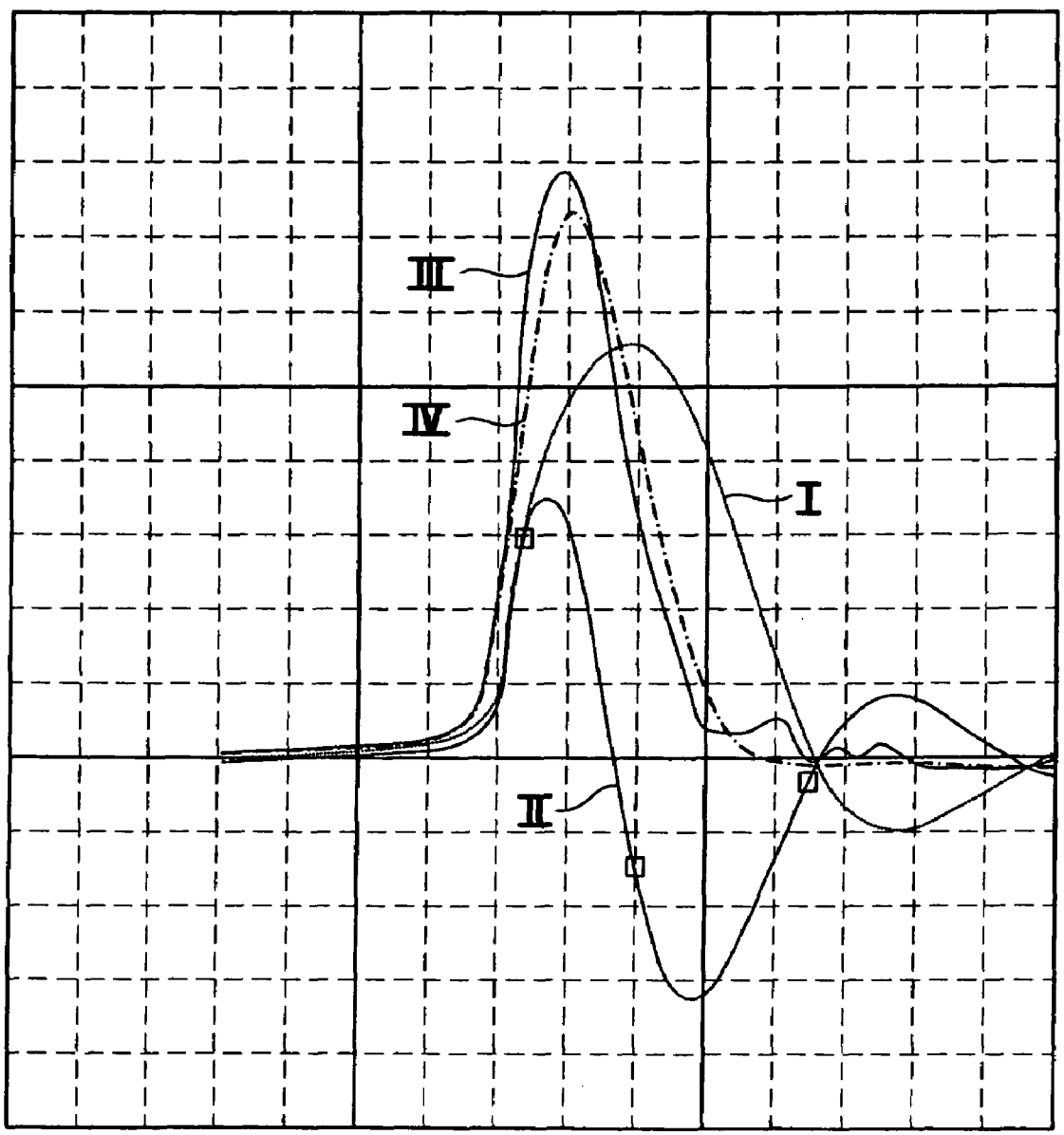
FIGS. 6a and 6b illustrate the time histories for partial current flows in the circuit arrangement according to FIG. 5.
Figure 6B:
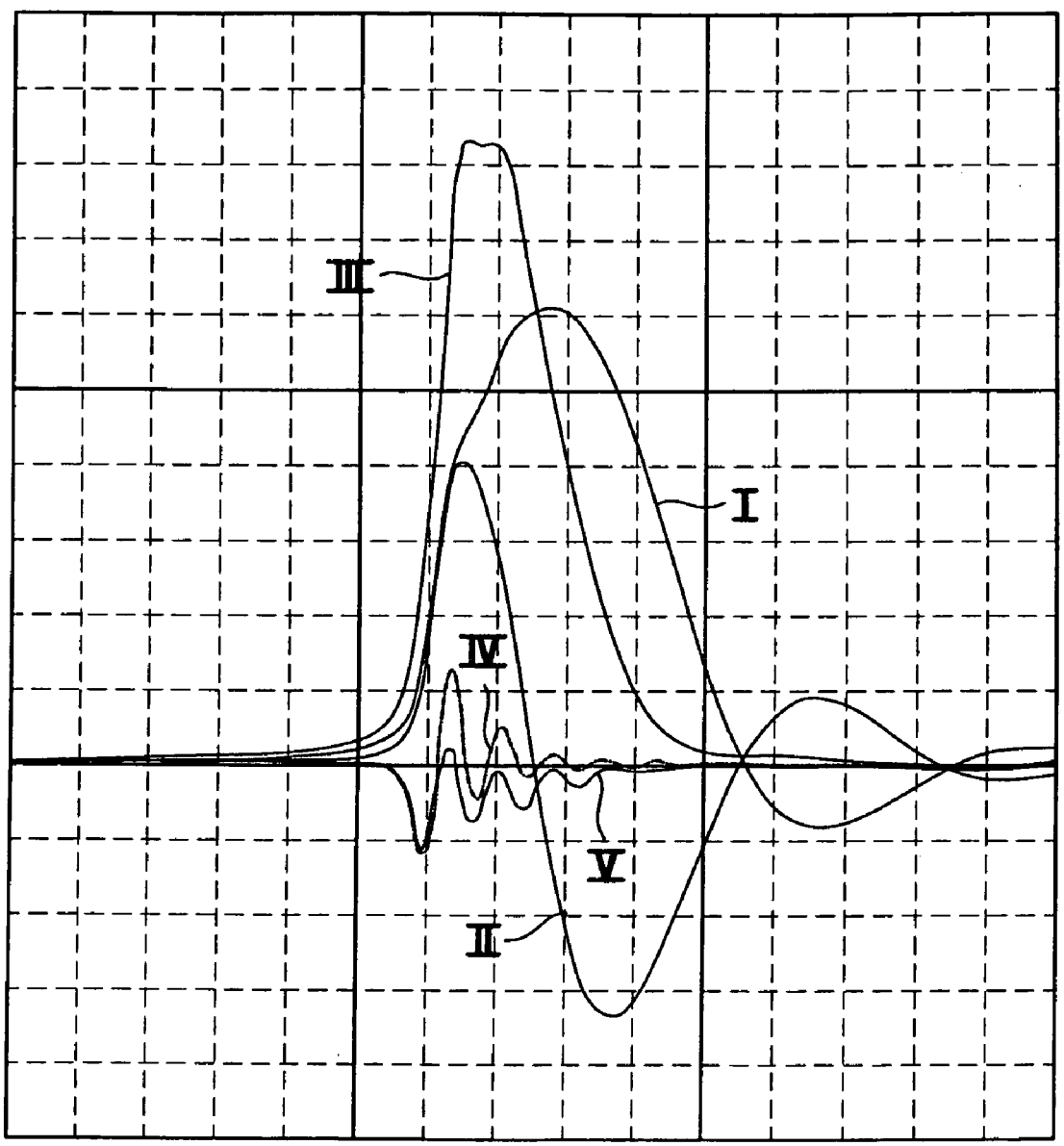
Figure 6C:
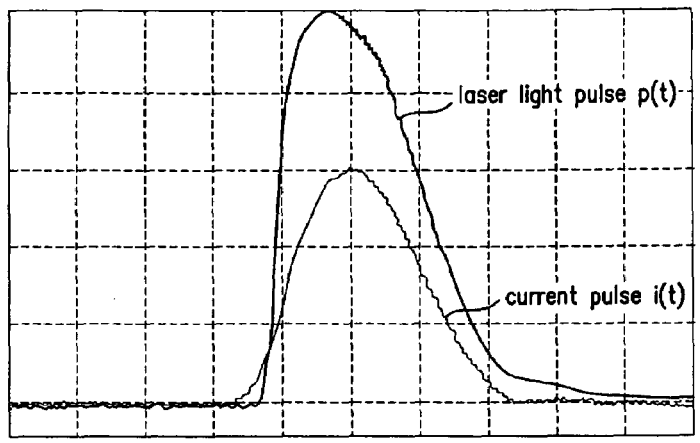
FIG. 6c shows the time history for a current pulse and a light pulse generated with the circuit arrangement according to FIG. 4.

FIG. 6c shows the typical time histories for the current pulses i(t), generated in the circuit arrangement 1 according to FIG. 4 and/or FIG. 5, and thus also the light pulses p(t) generated in the laser diode 2. The comparison to FIG. 3 shows that the matching circuits 5, 6 according to the invention consequently exhibit a considerable improvement in the signal curves for the current pulses i(t) and therefore also the light pulses p(t).

FIGS. 6a, b show different current-path simulations for the circuit arrangement 1 according to FIG. 5.

FIG. 6a illustrates a simulation of the circuit arrangement 1 as shown in FIG. 5, wherein I and II represent the time histories of the partial current flows through the resistance $R_3$ and the capacitor $C_3$ of the RC element $R_3C_3$. The total current flow through the RC element $R_3C_3$ is furthermore shown in FIG. 6a with III, that is to say the total simulated current flow through the laser diode 2. The measured current flow through the laser diode 2 is shown with IV.

The simulation results illustrated in FIG. 6a show that with a suitable dimensioning of the components $R_3$ and $C_3$ of the RC element $R_3C_3$, the time history for the total current flow can be specified precisely. The two partial current flows through $R_3$ and $C_3$ add up to a steep rising edge for the total current flow while undershoots in the current flowing through $R_3$, which are caused by inductive components, are compensated by overshoots in the current flowing through $C_3$. The amplitudes and zero passages of the partial current flows in this case can be adjusted optimally through a careful selection of $R_3$ and $C_3$.

FIG. 6b shows an expanded simulation which, in addition to the current flows I, II through $R_3$ and $C_3$, also takes into account the time constants $R_2C_2$ and $R_4C_4$ with V and VI as additional compensation elements in the circuit arrangement according to FIG. 5, so as to generate the total current III which flows through the laser diode 2. By adding these additional compensation elements, the rise time and pulse shape of the total current flow through the laser diode can be further improved as compared to the simulation in FIG. 6a, without resulting in a worsening of the post-oscillation behavior.

Figure 7:
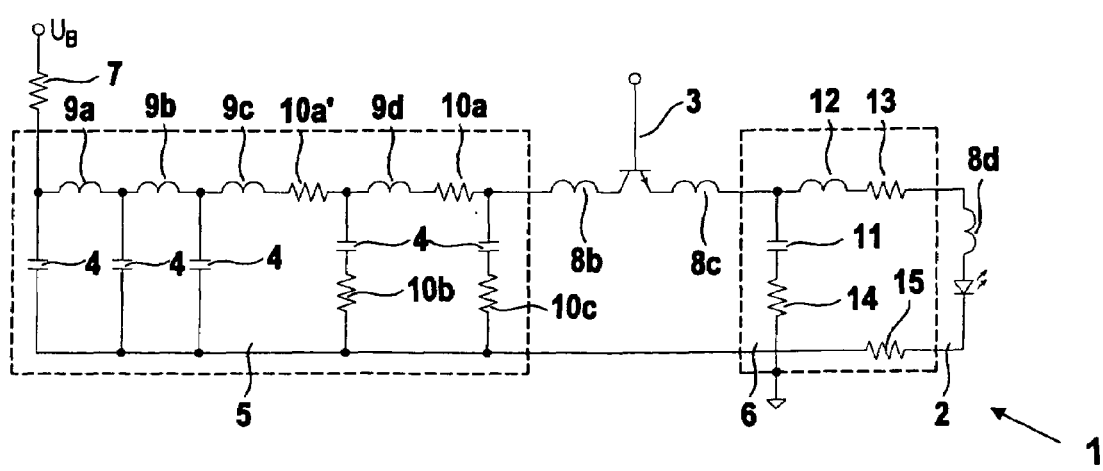
FIG. 7 shows a detailed representation of a second embodiment of the circuit arrangement according to the invention for generating light pulses.

FIG. 7 contains an additional exemplary embodiment of the circuit arrangement 1 according to the invention. Coinciding with the exemplary embodiment according to FIG. 5, the circuit arrangement 1 according to FIG. 7 again comprises a laser diode 2 functioning as electro-optical converter and an avalanche transistor functioning as switching element 3. The supply voltage $U_B$ is again conducted via the resistance 7 to the charge store. However, the charge store for the present case comprises a multiple-unit arrangement of charge capacitors 4, wherein these charge capacitors 4 are integrated into the first matching circuit 5. Coinciding with the exemplary embodiment according to FIG. 5, the second matching circuit 6 forms a separate circuit between the switching elements 3 and the laser diode 2.

The matching circuits 5, 6 in turn function to compensate the interfering influences caused by parasitic inductances 8b-8d, meaning the matching circuits 5, 6 prevent the current and voltage waves from traveling back and forth between the charge store and the switching element 3 as well as the switching element 3 and the laser diode 2.

For the embodiment shown in FIG. 7, a total of five charge capacitors 4 are provided for the first matching circuit 5, wherein these are separated by inductances 9a, 9b, 9c and 9d. Additional charge capacitors that are separated by corresponding inductances may advantageously be provided as part of the arrangement of the first three charge capacitors 4 which are separated by the inductances 9a, 9b. The last two charge capacitors 4 are incorporated into a network which comprises the resistances 10a, 10b and 10c as further components. The first three capacitors 4 and the last two capacitors 4 may be separated by a resistance 10a'.

The second matching circuit 6 comprises a capacitor 11, an inductance 12, as well as three resistances 13, 14, 15.

In addition, the matching circuit 6 in the circuit arrangement 1 functions to simulate a transmission line with defined wave resistance and defined limit frequency to prevent the reflection of current and voltage waves within the circuit arrangement 1. This embodiment of the circuit arrangement 1 consequently also provides a characteristic for the current pulses i(t) and the light pulses p(t) which corresponds to FIG. 6c. Whereas the embodiment of the matching circuit 5, 6 as shown in FIG. 5 has a particularly simple layout with respect to the HF circuitry, owing to the use of RC elements, the matching circuits 5, 6 shown in FIG. 7 permit a particularly broad adaptation to the parasitic inductances 8b, 8c and 8d. A minimum rise time with simultaneous control of the pulse duration and the decay time can thus be achieved for specific embodiments of the laser diode 2 and/or the switching element 3.

The circuit arrangements 1 shown in FIGS. 4, 5 and 7 can advantageously be used as transmitting units in optical sensors, wherein these are in particular distance sensors operating based on the light-transit time method. The sensors are furthermore provided with a receiver for receiving light pulses and an evaluation unit in which the distances to detected objects are determined in dependence on the signals received at the receiver. With a distance sensor of this type, the laser diode 2 of the transmitting unit emits sequences of light pulses with a predetermined pulse-pause ratio, wherein the light pulses p(t) have extremely short rise times, typically below one nanosecond, and pulse durations of approximately one nanosecond as a result of using the matching circuits 5, 6. For the distance determination, the transit time of a light pulse from the distance sensor to an object and back to the distance sensor is evaluated in each case. In the simplest case, the distance sensor emits light pulses in a fixedly predetermined direction. The distance sensor can furthermore also be embodied as a scanning sensor, for which the emitted light is periodically deflected within a flat or three-dimensional area to be monitored.

It will be understood that the above description of the present invention is susceptible to various modifications, changes and adaptations, and the same are intended to be comprehended within the meaning and range of equivalents of the appended claims.

What is claimed is:

1. A circuit arrangement for generating light pulses, comprising:
   an electro-optical converter;
   a switching element;
   a charge store, wherein the electro-optical converter is connected to the charge store via the switching element, and wherein a closing of the switching element triggers a discharging process in the charge store which generates an electrical pulse that is converted to a light pulse in the electro-optical converter;

a first impedance matching circuit, comprising at least one resistor and at least one capacitor, operationally connected between the charge store and the switching element to match impedance between the charge store and switching element and to compensate for the parasitic inductances of the charge store and the switching element such that current and/or voltage waves, reflected between the switching element and the charge store, are minimized; and a second impedance matching circuit, comprising at least one resistor and at least one capacitor, operationally connected between the switching element and the electro-optical converter to match impedance between the switching element and electro-optical converter and to compensate for the parasitic inductances of the switching element and the electro-optical converter such that current and/or voltage waves, reflected between the electro-optical converter and the switching element, are minimized.

2. The circuit arrangement according to claim 1, wherein the electro-optical converter comprises a laser diode.

3. The circuit arrangement according to claim 1, wherein the switching element comprises a transistor.

4. The circuit arrangement according to claim 1, wherein the switching element comprises an avalanche transistor.

5. The circuit arrangement according to claim 1, wherein the charge store is discharged by closing the switching element.

6. The circuit arrangement according to claim 1, wherein the charge store comprises a charge capacitor.

7. The circuit arrangement according to claim 1, wherein the charge store comprises a multi-unit arrangement of charge capacitors.

8. The circuit arrangement according to claim 1, wherein the first matching circuit constitutes a separate unit for the impedance matching between the charge store and the switching element.

9. The circuit arrangement according to claim 8, wherein the first matching circuit comprises an arrangement of RC elements.

10. The circuit arrangement according to claim 7, wherein the charge store includes the first matching circuit to match the impedance between the charge store and the switching element.

11. The circuit arrangement according to claim 10, wherein the first matching circuit comprises an arrangement of inductances which separate capacitors of the charge store.

12. The circuit arrangement according to claim 11, wherein the first matching circuit further includes resistances associated with the inductances.

13. The circuit arrangement according to claim 1, wherein the second matching circuit is a separate unit between the switching element and the electro-optical converter.

14. The circuit arrangement according to claim 13, wherein the second matching circuit comprises at least one RC element.

15. The circuit arrangement according to claim 13, wherein the second matching circuit comprises at least one RLC element.

16. An optical sensor comprising a transmitting unit including the circuit arrangement according to claim 1.

17. A method of making distance measurements, comprising utilizing the optical sensor according to claim 16 to make distance measurements on the basis of light transit-time.

* * * * *